(12) United States Patent
Hart (10) Patent No.: US 6,236,949 B1
(45) Date of Patent: May 22, 2001

(54) DIGITAL SENSOR APPARATUS AND SYSTEM FOR PROTECTION, CONTROL AND MANAGEMENT OF ELECTRICITY DISTRIBUTION SYSTEMS

(75) Inventor: Ronald G. Hart, Victoria (CA)

(73) Assignee: Power Measurement Ltd. (CA)

( * ) Notice: Subject to any disclaimer, the term of this patent is extended or adjusted under 35 U.S.C. 154(b) by 0 days.

(21) Appl. No.: 09/414,479

(22) Filed: Oct. 7, 1999

Related U.S. Application Data (63) Continuation of application No. 08/798,724, filed on Feb. 12, 1997, now Pat. No. 5,995,911.

(51) Int. Cl.$^7$ .................................................. G01R 19/00
(52) U.S. Cl. ................................ 702/64; 702/60; 702/62; 324/76.11; 324/126; 700/286
(58) Field of Search .................................. 702/64, 60, 62, 702/65; 324/126, 76.11; 700/286

(56) References Cited

U.S. PATENT DOCUMENTS

| | | |
|---|---|---|
| 4,415,968 | 11/1983 | Maeda et al. . |
| 4,709,339 | 11/1987 | Fernandes . |

OTHER PUBLICATIONS

"Phasors Revisited", Elmore, Presented to Western Protective Relay Conference, Oct. 23–25, 1990, Spokane, Washington.

"Power System Applications for Phasor Measurement Units", Burnett, et al., *IEEE Computer Applications in Power, Jan.*, Jan., 1994.

Macrodyne Inc. Model 1690 Phasor Measurement Unit, Product Description, Jan. 24, 1995.

"Metering for Transmission Access", Logini Digital KWH Inc., Pittsburgh, PA, 1996.

Adaptive Out–Of–Step Relaying Using Phasor Measurement Techniques, Centeno, et al., *IEEE Computer Applications In Power*, Oct. 1993.

*Primary Examiner*—Marc S. Hoff
*Assistant Examiner*—Hien Vo
(74) *Attorney, Agent, or Firm*—Brinks Hofer Gilson & Lione (57) ABSTRACT

A sensor apparatus for monitoring voltage and/or current in an electric circuit and a system for monitoring voltages and currents in a system wherein electricity is distributed in a plurality of circuits. A sensor apparatus is associated with each phase conductor in each of the circuits. The sensor apparatus senses the electricity in the phase conductor and provides a digital output that is representative of the sensed electricity in the phase conductor. The digital output preferably includes phasor data for the sensed phase conductor. The monitoring system includes a plurality of such sensor apparatuses. The plurality of sensor apparatuses are coupled to a digital data network that provides for the exchange of sensed data among nodes on the digital data network. On a node of the network, phasor data from some of the plurality of sensor apparatuses are summed or otherwise processed to obtain phasor data representative of a plurality of the circuits.

27 Claims, 6 Drawing Sheets

DIGITAL SENSOR APPARATUS AND SYSTEM FOR PROTECTION, CONTROL AND MANAGEMENT OF ELECTRICITY DISTRIBUTION SYSTEMS

This application is a continuation of application Ser. No. 08/798,724, filed Feb. 12, 1997, now U.S. Pat. No. 5,995,911 issued Nov. 30, 1999.

This application is related to the co-pending application entitled "PHASOR TRANSDUCER APPARATUS AND SYSTEM FOR PROTECTION, CONTROL, AND MANAGEMENT OF ELECTRICITY DISTRIBUTION SYSTEMS" Ser. No. 08/798,723, filed on even date herewith, the entire disclosure of which is incorporated by reference herein.

This application is continuation of U.S. Pat. No. 5,995,911 entitled "DIGITAL SENSOR APPARATUS AND SYSTEM FOR PROTECTION, CONTROL, AND MANAGEMENT OF ELECTRICITY DISTRIBUTION SYSTEMS".

BACKGROUND OF THE INVENTION

The present invention relates to systems and components for the protection, control, and/or energy management of electricity distribution systems for electric utility, industrial, manufacturing, commercial, and/or institutional use.

Monitoring of electric parameters, such as current, voltage, energy, power, etc., particularly the measuring and calculating of electric parameters, provides valuable information for power utilities and their customers. Monitoring of electric power is important to ensure that the electric power is effectively and efficiently generated, distributed and utilized. Knowledge about power parameters such as volts, amps, watts, phase relationship between waveforms, KWH, KVAR, KVARH, KVA, KVAH, power factor, frequency, etc. is of foremost concern for utilities and industrial power users. In addition, monitoring of electricity can be used for control and protection purposes.

Typically, electricity from a utility is fed from a primary substation over a distribution cable to several local substations. At the substations, the supply is transformed by distribution transformers from a relatively high voltage on the distributor cable to a lower voltage at which it is supplied to the end consumer. From the substations, the power is provided to industrial users over a distributed power network that supplies power to various loads. Such loads may include, for example, various power machines.

In such arrangements, utilities need to measure power coming out of or into the generating station or going into a power station. It is important to minimize the phase relationship between the current and voltage waveforms of the power being transmitted to minimize losses. It is also important to minimize the amount of harmonics that are present in the voltage and current waveforms. Also, the ability to detect the presence and magnitude of faults in the power system is important. Thus, accurate measurement of these waveforms is important.

In industrial applications, it is important to continuously monitor the voltage, current, phase, harmonics, faults and three phase balance of the power into the machine. These parameters may vary with the machine load. With knowledge of these parameters, the industrial user can better adjust and manage the loads to control machines, determine alarm conditions and/or more efficiently use the power.

Monitoring of electric parameters involves several components. For example, voltage transformers and current transformers are coupled to various electric transmission lines to measure the voltage and current in the line. Some conventional current and voltage transformers are relatively accurate and therefore suitable for power monitoring and measurement. However, such transformers may lack dynamic range, thereby rendering them less suitable for protection purposes that require a broad dynamic range. Other known conventional current and voltage transformers have a wide dynamic range making them suitable for protection purposes. However, these types of voltage and current transformers lack the accuracy needed for power monitoring and measurement. Thus, some facilities have installed both kinds of voltage and current transformers—one kind for accuracy for power measurement and monitoring and another kind for protection purposes. Accordingly, it would be advantageous if a current and/or voltage measuring device were available that could provide both high accuracy and wide dynamic range.

Another consideration related to present voltage and current transformers relates to worker safety. Conventional current transformers are high energy devices. If a worker accidentally open circuits the output of a present current transformer when the primary is energized, a very high voltage can develop. This high voltage represents a potentially hazardous condition that can cause grave or fatal injuries to a worker who might accidentally come into contact with the open circuit. Utilities and electric contractors have developed elaborate and expensive safety procedures to prevent this problem. However, despite these procedures, serious accidents still occasionally occur. Thus, it would be advantageous if a current and/or voltage monitoring device were available that could reduce the risk of this potential safety problem.

Accordingly, it is an objective of the present invention to provide a component and/or system that have improved capability to measure electric parameters. It is a further objective to provide an improved sensor component and system that have greater safety by reducing risk of accidental exposure to high voltage.

SUMMARY OF THE INVENTION

To achieve the foregoing and other objectives, there is provided an improved voltage and/or sensor apparatus for monitoring voltage and/or current in an electric circuit in a system that distributes electricity. A sensor apparatus is associated with each phase conductor in the circuit. The sensor apparatus senses the electricity in the phase conductor and provides a digital output that is representative of the sensed electricity in the phase conductor.

According to a further aspect, there is provided a sensor apparatus that monitors voltage and/or current in a phase conductor of an electric circuit and that provides a digital output that includes data representing the phasor of the electricity in the sensed phase conductor.

According to another aspect, there is provided a monitoring system for monitoring voltages and currents in a distribution system wherein electricity is distributed in a plurality of circuits. The monitoring system includes a plurality of sensor apparatuses that monitor electricity in the electric circuits and that provide digital data outputs representative thereof. The plurality of sensor apparatuses are coupled to a digital data network that provides for the exchange of sensed data among nodes on the digital data network. On a node of the network, data from some of the plurality of sensor apparatuses are summed or otherwise processed to obtain data representative of a plurality of the electric circuits or a plurality of phases of one circuit.

DETAILED DESCRIPTION OF THE PRESENTLY PREFERRED EMBODIMENTS

1. General

Figure 1:
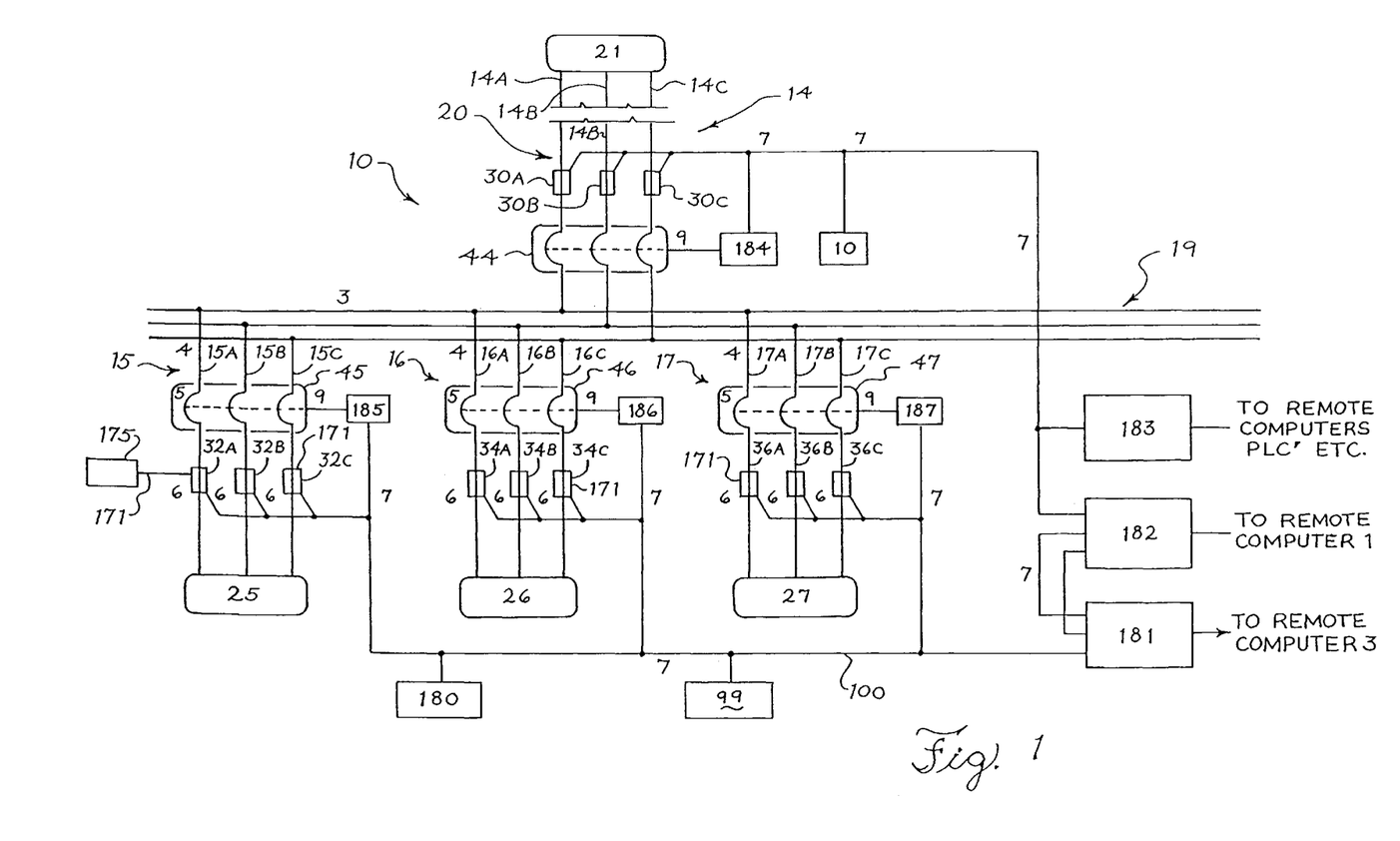
FIG. 1 is a diagram illustrating an electricity distribution system incorporating embodiments of the present invention.

Referring to FIG. 1, there is illustrated a diagram of an electricity distribution system 10. The electricity distribution system 10 represents a typical distribution system that may be used in factories or utilities, or in industrial, commercial, manufacturing and/or institutional use. For example, the system 10 may represent a part of a typical three-phase electric switchgear or an electricity distribution substation arrangement. Such an arrangement may be located in a manufacturing facility in which electrical energy is distributed to a plurality of loads, which may be various types of machines, motors, welding equipment, furnaces, mills, etc, The distribution system 10 receives electrical power over a power line 20 from an electric utility 21. In the electricity distribution system 10, three-phase electric power is distributed over a plurality of three-phase electric circuits, such as electric circuits 14, 15, 16, and 17. Although only four three-phase circuits are illustrated in FIG. 1, it is understood that the electricity distribution system 10 may typically include many more such circuits.

As further illustrated in FIG. 1, one of the circuits, i.e. the circuit 14, is a main circuit. The main circuit 14 feeds electric power to a three-phase substation bus 19. Multiple feeder or branch circuits, such as the three-phase circuits 15, 16, and 17, obtain the three-phase electric power from the substation bus 19. The feeder circuits 15, 16, and 17, distribute the electric power to a plurality of loads 25, 26, and 27. (Note that instead of distributing electric power directly to a load, any of the feeder circuits, such as feeder circuits 15, 16, and 17, may feed power to additional distribution feeder circuits which in turn may distribute power either directly to loads or to still additional feeder circuits. Also, note that the "load" for the main circuit 14 may be regarded as the combined loads of the feeder circuits 15–17.) The electricity distribution system 10 may also include numerous other components found in typical installations, such as switches and transformers.

In the system 10 shown in FIG. 1, the main circuit 14 is shown to be comprised of three separate phase conductors 14A, 14B and 14C; the branch circuit 15 is shown to be comprised of separate phase conductors, 15A, 15B, and 15C; the branch circuit 16 is shown to be comprised of separate phase conductors 16A, 16B, and 16C; and the branch circuit 17 is shown to be comprised of separate phase conductors 17A, 17B, and 17C; and so on.

2. Digital Sensor Device

In a first embodiment, there is a voltage and current sensor device (also referred to as a "detection device" or "sampler") associated with each of the phase conductors of each of the circuits. For example referring to the main circuit 14, a voltage and current sensor device 30A is associated with the phase conductor 14A, a voltage and current sensor device 30B is associated with the phase conductor 14B, and so on. Similarly, in the branch circuit 15, a voltage and current sensor device 32A is associated with the phase conductor 15A, a voltage and current sensor device 32B is associated with the phase conductor 15B, and so on. In addition, the electric distribution system 10 may include additional circuits that do not include voltage and current sensor devices. Also associated with each of the circuits 14, 15, 16, and 17, is a circuit breaker, such as breakers 44, 45, 46, and 47, associated with the circuits 14, 15, 16, and 17, respectively. The circuit breakers are connected to their respective sensor devices, in a manner described below.

Figure 2:
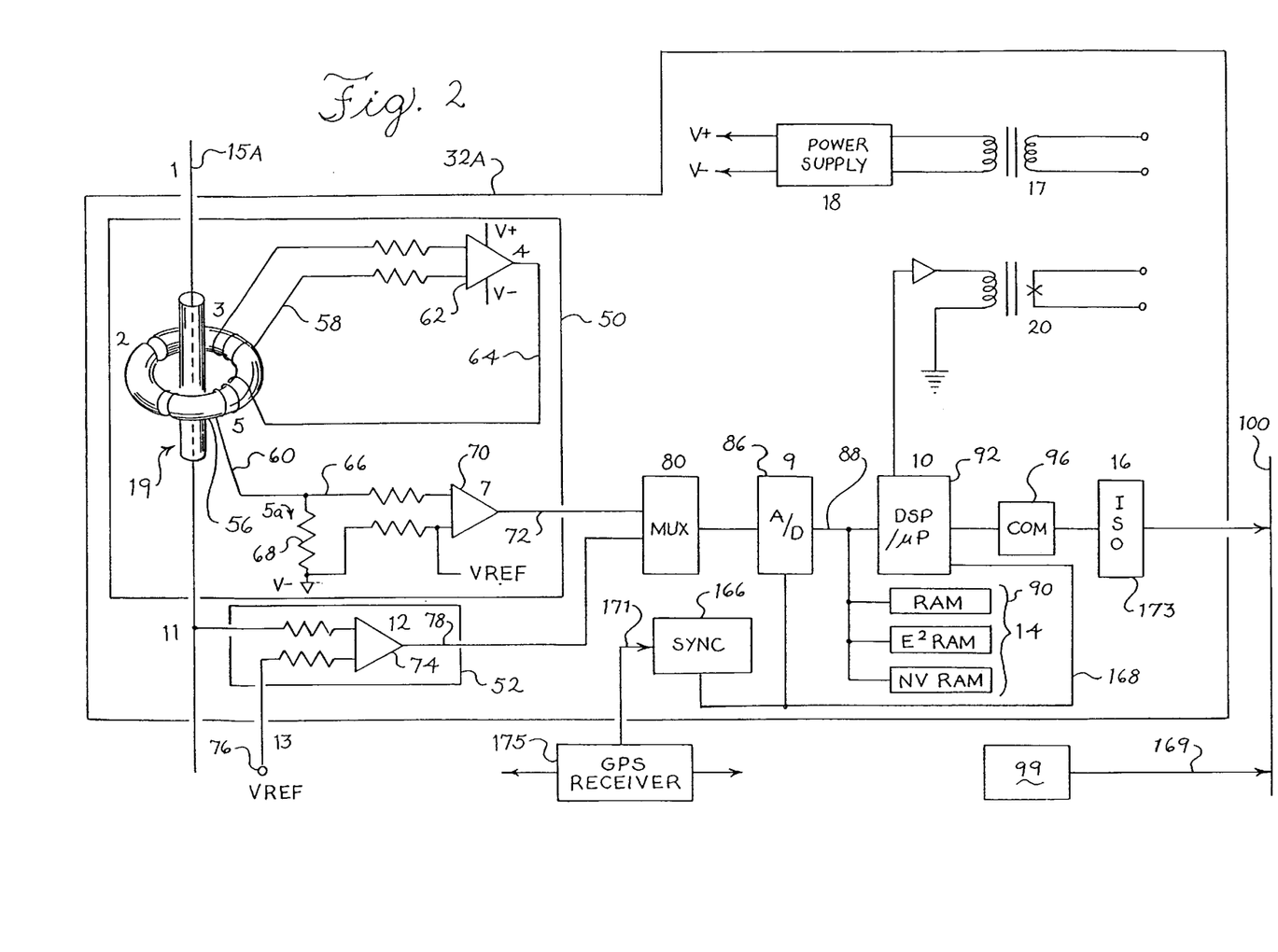
FIG. 2 is a schematic diagram of a voltage and current detection device shown in FIG. 1.

FIG. 2 shows a schematic diagram of the voltage and current sensor device 32A. The sensor device 32A is associated with the phase conductor 15A of the feeder circuit 15. The other sensor devices 32B and 32C associated with the other phase conductors in the circuit 15, as well as the sensor devices associated with the phase conductors in the other circuits, may have a similar or identical construction.

The phase conductor 15A carries one phase of the three-phase periodic alternating current in the branch circuit 15. The voltage and current sensor device 32A includes a current sensor portion 50 and a voltage sensor portion 52. The current sensor portion 50 senses the current in the line 15A. The current sensor portion 50 may be comprised of a magnetic sensor that includes a split ferrite toroid 56 that encircles the conductor 15A. The toroid 56 is split to allow it to be installed on or removed from the electrical conductor 15A without interrupting or deenergizing the conductor 15A. The magnetic field created by the electric current in the conductor 15A couples to the ferrite toroid 56. The toroid 56 has an error winding 58 and a cancellation winding 60. These windings are formed of multiple turns of copper wire wound around the toroid 56 in a manner commonly practiced in the transformer industry. The error winding 58 senses the magnetic field in the toroid 56 and generates a voltage which is fed to an error amplifier 62. The error amplifier 62 generates a voltage on an output 64 that drives a current through the cancellation winding 60. This circuitry is arranged so that the magnetic field created by the current through the cancellation winding 60 exactly cancels the magnetic field created by the electric conductor 15A, so that the magnetic field sensed by the error winding 58 is zero. This is accomplished by configuring the error amplifier 62, cancellation winding 60, and error winding 58 to operate in a negative feedback mode, as known to those of skill in the art.

The current of the output 66 of the cancellation winding 60 is fed through a shunt resistor 68. An amplifier 70 receives the voltage developed across the shunt resistor 68 and conditions the voltage to provide an output 72 suitable for sending to the remainder of the components of the voltage and current sensor device 32A, as explained below. The output 72 is an analog signal which is precisely proportional at any instant to the current in the primary conductor 15A. The error cancellation technique described above provides excellent accuracy for a very wide range of current levels and signal frequencies in the primary conductor 15A.

As mentioned above, the voltage and current sensor device 32A also includes the voltage sensor portion 52. The voltage sensor portion 52 comprises an amplifier 74 that scales and conditions the voltage in the conductor 15A to a level suitable for sending to the remainder of the components of the voltage and current sensor device 32A.

The conditioned analog signals 72 and 78 from the current sensor portion 50 and the voltage sensor portion 52 are fed to a multiplexer 80. The multiplexer 80 selects which of the analog signals, 72 or 78, are output to an analog to digital converter 86. The multiplexer 80 alternately selects one of the analog signals 72 and 78. The analog to digital converter 86 repeatedly samples the analog signals and converts the samples to digital value signals at an output 88. In a preferred embodiment, the analog to digital converter 86 samples the analog signals continuously. The output 88 of the analog to digital converter is a digital signal that represents the magnitudes of the analog signals received into the converter 86 at the instant that they were sampled. The digital sample value output 88 generated by the analog to digital converter 86 is provided to buffers 90. The digital sample value output 88 is retrieved from the buffers 90 by a local processor 92 which computes phasor data from the digital sample values. The local processor 92 may also include a digital signal processor.

The local microprocessor 92 is coupled to one or more communication ports 96 which connect the voltage and current sensor 32A to a network 100. The communication port 96 may be used to transmit the digital sample values or the phasor data or other related data. The communication port 96 may be a conventional network-compatible port such as a 10 base Tethernet port. The voltage and current sensor 32A may, optionally, include a local display coupled to the local microprocessor 92. The local display is used to provide for visual observation of data, including volts, amps, watts, vars, power factor, frequency, etc., as well as provide energy consumption recording of kwh, kvarh, kvah import, export and totals for the phase conductor 15A. The voltage and current sensor 32A may also include auxiliary local I/O ports also coupled to the local microprocessor 92.

The voltage and current sensor device 32A also includes a time synchronization circuit 166. The time synchronization circuit 166 outputs a highly accurate local synchronization signal 168 to the local processor 92 and to the analog to digital converter 86. The synchronization circuit 166 may utilize two processes to provide the highly accurate local synchronization signal 168 internal of the sensor device 32A. First, the synchronization circuit 166 receives a network global synchronization signal 169 over the network 100 via the communications port 96. The network global synchronization signal 169 may be a conventional-network-generated signal in a UNIX format that synchronizes the synchronization circuit 166 to within approximately 10 to 200 millisecond. This network global synchronization signal 169 may be generated by a network timing reference 99 coupled to the data network 100. In addition, the synchronization circuit 166 uses a GPS-type signal 171. The GPS-type signal may be obtained using a conventional receiver 175 that receives the GPS satellite signals and provides an accurate timing signal output. The GPS-type signal 171 is used to fine tune an internal time clock of the synchronization circuit 166 to within approximately 1 microsecond.

As shown in FIG. 1, a single GPS receiver 175 may provide a GPS output signal 171 to more than one voltage and current sensor device, such as devices 32A, 32B, 32C, 34A, 34B . . . 36C, and so on. The GPS output signal 171 may be distributed to each of the voltage and current sensor devices by a suitable communication means, such a twisted pair, coaxial cable, wireless, and so on. Alternatively, more than one GPS receiver may be used. It is preferred that the distance between the GPS receiver and the synchronization circuit in the voltage and current sensor device be limited to avoid possible inaccuracies due to time delays resulting from cable length. Accordingly, in larger installations in which the voltage and current sensor devices are physically located over a relatively large area, more than one GPS receiver may be preferable. In a still further embodiment, each of the voltage and current sensor devices may have its own GPS receiver located internally thereto.

Referring again to FIG. 2, using the local synchronization signal 168 from the synchronization circuit 166, the local microprocessor 92 applies a time stamp to the digital sample values (or to the phasor data computed from the digital sample values). The local microprocessor 92 transmits the phasor data or the digital sample values as digital data in real time onto the network 100. (Optionally, the local microprocessor 92 may perform additional processes on the digital sample values or the phasor data prior to transmitting them in real time over the network 100. Such additional processes may include downsampling the data, time alignment, and so on.) In a preferred embodiment, the local microprocessor 92 transmits the digital data onto the network 100 continuously. In addition, the current and voltage sensor device 32A may include an isolation circuit 173 located between the communications port 96 and the network 100.

3. The Data Network

Referring again to FIG. 1, each of the voltage and sensor devices 30A, 30B, . . . 36C is connected to the data transmission network 100. The data transmission network 100 provides real time data communication among the various components connected to the network. The data transmission network 100 may be implemented using conventional local area network (LAN) or wide area network (WAN) technology. The network 100 may use conventional communications protocols, such as point-to-point or multi-point data transmission. The network 100 should be able to sustain the data flow generated by the various devices. Data propagation times should be short, deterministic and reliable.

In one embodiment, a TCP/IP ethernet communications network is used. TCP/IP ethernet is used due to its high data throughput capabilities and its ability to be easily segmented to control data loading and propagation times. In alternative embodiments, the network 100 may include digital radio, a data circuit, fiber optic data transmission, or combinations of these techniques to couple the data. These alternatives also provide the advantage of isolating the metering and protection devices from the electrical currents in the circuits being monitored.

Also connected to the data transmission network 100 are one or more node processor, such as a first node processor 180, a second node processor 181, a third node processor 182, a fourth node processor 183, and so on. It is understood that there may be many node processors connected to the network 100 in a typical embodiment. The data transmission network 100 enables real time data communication between each of the voltage and current sensors associated with a circuit, such as the voltage and current sensor devices 32 associated with the circuit 15, and any of the node processors connected to the network, as described below. (By "real time", it is meant that the elapsed time from a significant magnitude change in any of the analog waveforms sensed by the sensor devices 32 until that change is reflected by a corresponding change in the value computed by a node processor is less than four cycles.) Further, the voltage and current sensor devices 32 may be connected to local computers or remote computers that are also connected to the network 100, either locally or remotely. Also connected to the network may be programmable logic controllers and digital control systems.

4. The Nodes on the Data Network

The node processors 180, 181, 182, and 183 are microprocessor or computer-based devices that can send and receive data over the network 100. In particular, one or more of the node processors receive data from the voltage and current sensor devices 30A, 30B, . . . 36C, as well as from other devices. For example, any one or more of the nodes may include the appropriate hardware and software to receive and process data from the sensor devices, such as the data output from the sensor 32A on its output ports 96 in FIG. 2. In a preferred embodiment, the nodes process the information using object-oriented program modules, as explained in more detail below.

The nodes may be implemented using a general purpose computer platform. For example, each node may be an IBM-compatible personal computer. Alternatively, the nodes may be implemented using a custom-designed computing device for specialized tasks. A custom-designed computing device may be used for higher performance. Custom-designed devices may include multiple processors or digital signal processors for very fast computational capabilities. A task-specific hardware platform, such as a 7700 ION, manufactured by Power Measurement Ltd., of Victoria, BC, may also be used.

Each node is preferably equipped with suitable hardware, such as RS-232, RS-485, ethernet, or other industry standard communications ports, so that it is network-compatible with the network 100. The nodes may also be equipped with multiple communication ports which allow them to connect to multiple voltage and current sensor devices or multiple central computers, or which allow nodes to be connected to a remote computer.

5. Protection Devices on the Data Network

Also connected to the data transmission network 100 are a plurality of protection devices. Specifically, a protection device is associated with each of the circuits. For example, a first protection device 184 is associated with the first circuit 14, a second protection device 185 is associated with the second circuit 15, and so on. The protection devices are microprocessor or computer-based devices (or nodes) that can send and receive data over the network 100. In particular, the detection devices receive data from the voltage and current sensor devices 30A, 30B, . . . 36C, or the node processors 180–183, as well as from other nodes on the network 100. In a preferred embodiment, the protection devices process the data using object-oriented program modules, as explained in more detail below.

The protection devices may be implemented using a general purpose computer platform. For example, the protection device may implemented on an IBM-compatible personal computer or on a task-specific hardware platform. Each protection device is preferably equipped with suitable hardware, such as RS-232, RS-485, ethernet or other industry standard communications ports, so that it is network-compatible with the network 100. The output of each of the protection devices is connected to the circuit breaker associated with its respective circuit. For example, the output of the first protection device 184 is connected to the circuit breaker 44 associated with the first circuit 14, the output of the protection device 185 is connected to the circuit breaker 45 associated with the second circuit 15, and so on.

6. Operations and Program Objects

The node processors have four principle functions: protection, control, energy management, and systems diagnostics. An individual node processor can provide any combination of these functions depending on the hardware, software, and/or software/firmware and the requirements of the user.

According to a present embodiment, the voltage and current sensor devices, the protection devices, and the node processors include appropriate software, such as programming and logic, to implement the desired functions, features, and operations. The software may be implemented in alternative ways including various programming languages, scripts, and architectures, and combinations of software and firmware, etc. In one preferred embodiment, the voltage and current sensors, protection devices, node processors and other components on the network 100 interact internally and with each other using an object-oriented programming architecture. One preferred object-oriented programming approach is disclosed in copending patent application Ser. No. 08/369,849, the entire disclosure of which is incorporated by reference herein.

If a node processor is implemented using an IBM-compatible personal computer, the personal computer may run the Virtual ION Processor software developed by Power Measurement Ltd. of Victoria, BC. This software allows standard ION modules to be implemented on an IBM-compatible personal computer. The ION communication architecture allows the inputs or outputs of any ION module on the node processor to be linked to the inputs or outputs of any ION module on the voltage and current sensor devices or the protection devices via standard communications networks.

Figure 3:
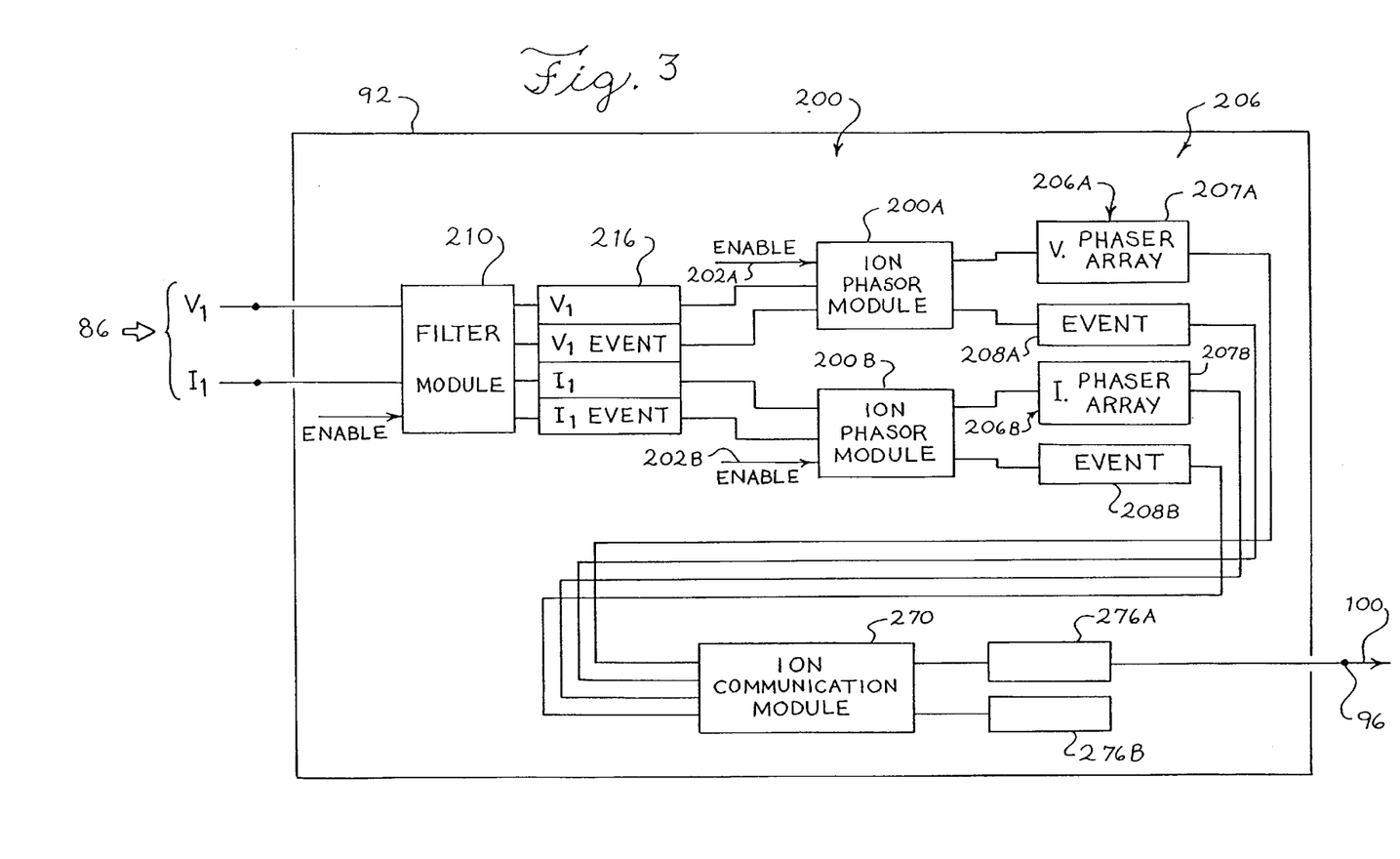
FIG. 3 is a block diagram of program functions incorporated on the local processor of the voltage and current detection device shown in FIGS. 1 and 2.

FIG. 3 is a diagram using the object-oriented architecture disclosed in the aforementioned copending application Ser. No. 08/369,849. The diagram of FIG. 3 shows modules which represent program objects. A "module" may be regarded to be an active object in the program architecture. Modules behave as both a client and a server. The client portion of a module contains the active components which perform the various tasks within the device. Modules act as "black boxes" that read data in at the inputs, manipulate the data in some fashion, and write the result to outputs. The inputs are read from registers and the outputs are written to registers.

The diagram of FIG. 3 shows a functional relationship between the program objects used in a preferred embodiment. The objects shown in FIG. 3 include objects that may be physically located (or that may be regarded as "running") on the voltage and current sensor devices and/or the node processors, or both. In a preferred embodiment, the modules shown in FIG. 3 are located on a single voltage and current sensor, such as the voltage and current sensor 32A. In a preferred embodiment, the other voltage and current sensors 30A, 30B, . . . 36C would include similar modules.

(1). Phasor Power Modules

As shown in FIG. 3, running on the voltage and current sensor device 32A (specifically on the local microprocessor 92) are a plurality 200 of phasor modules. In the embodiment shown, the plurality 200 of phasor modules includes two phasor modules one for each of the voltage and current channels. FIG. 3 shows the plurality of phasor modules 200 that receive the digitized values of the voltage and current signals, $V_1$ and $I_1$, that are output from the analog to digital converter 86 in FIG. 2. Each of the other voltage and current sensor devices (30A, 30B, . . . 36C of FIG. 1) would likewise include its own plurality of phasor modules 200 for receiving the digitally-converted values sensed by its corresponding voltage and current sensor portions associated with its corresponding phase conductor of its associated circuit. Alternatively, the phasor power modules 200 may receive their input from a digital filter module, described below.

In the embodiment shown in FIG. 3, the plurality 200 of phasor modules includes two phasor modules, 200A and 200B. The phasor module 200A receives as its input the digitized voltage signals, $V_1$, and the phasor module 200B receives as its input the digitized current signal $I_1$. In addition, each of these modules 200 includes an "enable" input, such as input 202A on module 200A and input 202B on module 200B. The "enable" input enables operation of the module. The default state of the enable input is "enabled" but the input may also be connected to a control module with a boolean output so that the phasor module may be disabled if required.

Each of the phasor modules 200 provides outputs in the form of a phasor module output registers, including a phasor array output register and a phasor event output register. Specifically, the voltage phasor module 200A provides outputs including a phasor array output register 206A and a phasor event output register 208A, and the current phasor module 200B provides outputs including a phasor array output register 206B and a phasor event output register 208B. The phasor array output registers 206 contain phasor value data. The phasor value data is computed by its respective phasor array module 200. The phasor value data represents the phasor of its respective digitized input voltage or current for each harmonic for which the module is enabled. The phasor value data may be updated on a regular basis as determined by setup parameters.

(The "phasor" may be a polar number, the absolute value or modulus of which corresponds to either the peak magnitude or the RMS value of the quantity, and the phase argument to the phase angle at zero time. Alternatively, the "phasor" may be a complex number having real and imaginary components values or the phasor may use rectangular or exponential notation. Phasors may be used to represent the voltage, current, power, or energy in a phase conductor, in an electric circuit, or in group of circuits. By contrast, conventional sensing devices generally measure only "power parameters." A "power parameter" may be regarded as a scalar representation of a voltage, current, power, frequency, etc., in the line. A "phasor array" may be an array or matrix of phasors. Phasor arrays may be used to represent the voltage, current, power, or energy phasors in the phase conductor, or circuit, or group of circuits, being sensed. Each element of the phasor array represents the phasor for a particular harmonic in a phase conductor voltage, power or energy signal. The array may be a single element array consisting of a single phasor for a single harmonic or the fundamental frequency.)

As mentioned above, each of the phasor modules 200 may also have an event output register which includes event data values. An "event" may be regarded as any exceptional occurrence in the module that warrants logging and the data values in the event registers 208 identify the cause, cause value, effect, effect value, and time of the events. An event may be an alarm condition or may be a occurrence such as changing the setup parameters. An event may be any occurrence brought about by a change in condition. In the embodiment of FIG. 3, the voltage phasor module 200A has an event data output register 208A and the current phasor module 200B has an event data output register 208B. The phasor value output registers 206 and the event data output registers 208 are separate objects that are the outputs of the phasor module objects.

In a preferred embodiment, the value data 206 and the event data 208 each includes a time stamp data that indicate the moment in time that the data represent.

As mentioned above, in one embodiment, the plurality of phasor modules 200 and their output registers 206 and 208 are included as program objects on the local microprocessor 92 in the voltage and current sensor device 32A. However, in alternative embodiments, the plurality of phasor modules 200 and their output registers 206 and 208 may be included as program objects on a microprocessor that is physically located remotely, such as on one or more of the node processors 180–183, or even on a microprocessor located on another of the voltage and current sensor devices, such as the voltage and current sensors 30A, 30B, . . . and so on. The program objects that perform the functions of the phasor modules 200 are not necessarily restricted to a specific physical location. If the program objects that perform the functions of the phasor modules are not physically located in the voltage and current sensor device associated with the phase conductor the voltage and current phasors of which are being computed by the modules, then the digitized outputs of the analog to digital converter may be transmitted over the network 100 to another microprocessor where the appropriate phasor modules are located.

As mentioned above, the phasor value data included in the phasor array output registers 206 represent the phasor values computed by each of the phasor modules for each harmonic that is enabled. There are several methods that can be used to compute the phasor array values. One preferred method is to use a fast fourier transform to compute the phasor value for each harmonic frequency from the digital sampled data.

Each of the modules 200 includes scaling and notation setup parameters that may be used to configure the module output format and scaling. For example, the modules 200 may be configured in various modes, e.g. wyevor delta, and the phasor notation may be provided in polar, rectangular, complex, or exponential notation. In addition, the scaling parameters may be set to provide for selection of units, percent, primary, secondary, or Engineering units.

(2). Filter Module

In a preferred embodiment, each voltage and current sensor device also includes a filter module 210. The filter module 210 is a programmable digital filter that down-samples the digitally-sampled data received by the processor 96 from the analog to digital converter 86. This module provides a programmable method to select a frequency range to which the all the modules downstream from the filter module will be responsive. The filter module 210 provides an important capability in systems that may have high levels of harmonics. The filter module 210 provides an output in the form of a filter module output register 216. The filter module output register 216 includes values that correspond to the samples received at the frequencies enabled. The filter module 210 also includes event register outputs which hold event values which may be similar to the event registers described previously in connection with the phasor modules. In alternative embodiments, the digital filtering function may be performed by the phasor modules 200.

(3). Communications Module on the Sensor Device

In a preferred embodiment, each voltage and current sensor device also includes a communications module 270. The communications module 270 is used to make the data in the output registers 206 of the modules 200 accessible to remote modules on other nodes on the network 100, such as the node processors 180–183. In a preferred embodiment, the communications module 270 allows external devices and/or modules to link to or communicate with any of the modules or registers on the voltage and current module 32A. The communications module 270 preferably uses data communications techniques described in the aforementioned copending application Ser. No. 08/369,849.

If the phasor array modules 200 are not located on the voltage and current sensor device 32A, the communications module 270 may be used to transmit the digitally sampled voltage and current values from the analog to digital converter 86 over the network 100 to a node processor or to another voltage and current sensor device having phasor array modules 200 that can receive the values and compute the phasor arrays.

The communications module 270 has communications output registers including communications data output register 276A and a communications output event register 276B. The data in the communications output registers 276 are transmitted via appropriate hardware such as a communications port 96 of the device 32A onto the data network 100.

(4). Phasor Power Meter Module

Figure 4:
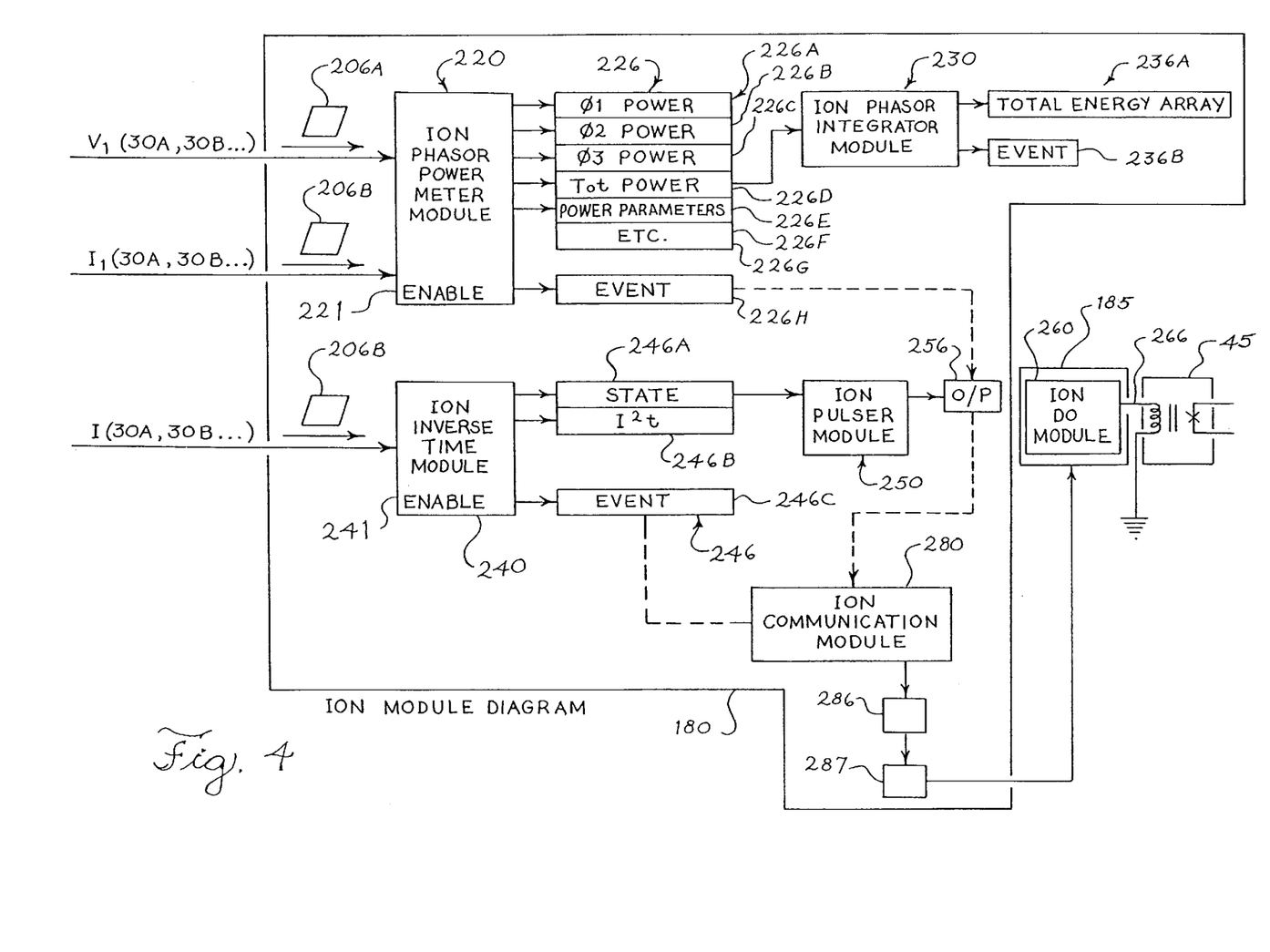
FIG. 4 is a block diagram illustrating program functions incorporated on a node processor in the embodiment of FIG. 1.

FIG. 4 is a functional diagram showing additional program objects. In a preferred embodiment, the program objects in FIG. 4 are located on a node processor, such as the node processor 180. The modules in FIG. 4 utilize as their input the data in the output registers 206 from the plurality of the voltage and current sensor devices, such as sensor devices 30A, 30B, . . . 36C. Thus, the node processor 180 is able to process phasor data from a plurality of phase conductors from a plurality of circuits, such as the circuits 14, 15, 16, and 17. The program objects in FIG. 4 receive data from the voltage and current sensor devices 30A, 30B, . . . 36C, over the network 100. Alternatively, since the voltage and current sensor devices can communicate with each other over the network 100, it is also possible to use a local microprocessor in one of the voltage and current sensor devices to run the program objects in FIG. 4.

The phasor values in the phasor array output registers 206A are provided as inputs to a phasor power meter module 220. The phasor power meter module 220 is preferably implemented as a program object on a local microprocessor of the node processor 180. The phasor power meter module 220 computes the phasor product of the voltage phasor arrays and the current phasor arrays for each phase in turn to generate the power phasor array for each phase. Also, the phasor power meter module 220 computes the sum of the power phasor arrays for all the phases to generate the total real, reactive, and apparent power parameters for all the harmonics that are enabled. An important function of the phasor power meter module 220 is the ability to buffer and time align the phasor array data from all the inputs so that the power calculation uses data which are representative of the same instant in time. The phasor power meter module 220 also includes an "enable" input 221 that enables the operation of the phasor power meter module 220.

The phasor power meter module 220 provides an output in the form of power meter output registers 226. The phasor power meter output registers 226 include the following registers: (1) a power phasor array register for each phase, i.e., registers 226A, 226B, and 226C, representing the real and reactive power for that phase for each harmonic that it enabled, (2) a total power phasor array register 226D, representing the three phase total real and reactive power for each harmonic which is enabled, (3) a total real power register 226E, (4) a total reactive power register 226F, (5) a total apparent power register 226G, and (6) an event register 226H.

The phasor power meter module 220 may be configurable to provide for selection of appropriate parameters for both its inputs and its outputs. For example, the phasor power meter module 220 may be configurable to provide its phasor output in various notations, such as polar, rectangular, complex, or exponential. The phasor power meter module 220 may be configured for scale, e.g. per unit, percent, or Engineering units. The phasor power meter module 220 may also be configurable for the number of harmonics enabled. Also, the phasor power meter module 220 may be configured to provide for the polarity of each input, i.e. an identification of whether an input should be added or subtracted when computing a sum.

Like the program objects that perform the functions of the phasor modules 200, the program object that performs the functions of the phasor power meter module 220 is not necessarily restricted to a specific physical location. For example, the phasor power meter module 220 may reside on any of the processor nodes 180–183, or alternatively, the phasor power meter module 220 may reside on a voltage and current sensor device. If the program object that performs the functions of the phasor power meter module are physically located on a voltage and current sensor device, then it can receive the phasor array output register values 206 over the network 100 from other voltage and current sensor devices.

(5). Phasor Integration Module

Some of the values in the phasor power meter module output registers 226 are used as inputs to a phasor integration module 230. Like the phasor power meter module 220, the phasor integration module 230 is preferably implemented as a program object. Specifically, the phasor integration module 230 uses as its input the phasor array data in the total power phasor array register 226D, representing the three phase total real and reactive power for each harmonic which is enabled. The phasor integration module 230 also receives inputs that include (1) an "enable" input to enable operation of the phasor integration module 230, (2) an input that selects the harmonics that are enabled for the phasor integration module, and (3) an input to reset the phasor integrator module to zero.

The phasor integration module 230 performs a time integration of selected input phasor arrays to compute energy phasor arrays for each enabled harmonic. The phasor integration module 230 provides an output in the form of an integration output register 236A and an integration event register 236B. The integration output register 236A includes data comprised of a phasor array result that represents the time integration of the input phasor array. When the input to the phasor integration module 230 is a power phasor array, the output array in the integration module output register 236A will be an energy phasor array which represents the real and reactive energy for each harmonic which is enabled.

The phasor integration module 230 may be configured by specifying a value for a divisor by which an integrand is divided before it is added to the result. The phasor integration module 230 may also be configured for selection of an integration mode to specify the type of integration to be performed.

Like the program objects that perform the functions of the phasor power meter module 220, the program object that performs the functions of the phasor integration module 230 is not necessarily restricted to a specific physical location. In one preferred embodiment, the program object that performs the functions of the phasor integration module is physically located on the same node processor 180 on which the phasor power meter module 220 is located. Alternatively, the phasor integration module 230 may receive its inputs over the network 100 from a phasor power meter output register 226 located on another node processor connected to the network 100.

(6). Inverse Time, Pulser, and Digital Output Modules and the Protection Devices The phasor values in the current phasor array output registers from a plurality of voltage and current sensor devices (for example, register 206B on the voltage and current sensor device 32A) are provided as inputs to an inverse time module 240. Like the phasor modules 200, the phasor power module 220, and the integration module 230, the inverse time module 240 is preferably implemented as a program object. The inverse time module 240 provides an overcurrent protection function. (The inverse time module 240 may also be regarded as an inverse current module or an $I^2T$ module). For example, the inverse time module 240 receives the digital data over the network 100 from the current phasor modules on the devices 32A, 32B, and 32C associated with the circuit 15 and processes the data to determine if there is a fault condition in the circuit 15. The inverse time module 240 also includes an "enable" input 241 that enables the operation of the inverse time module 240.

The inverse time module 240 provides an output in the form of inverse time output registers 246. The inverse time output registers 246 include the following registers: (1) a state register 246A, (2) an $I^2T$ value register 246B, and (3) an event register 246C. The inverse time module 240 may be configurable.

The state output register 246A of the inverse time module 240 is used as an input by a pulser module 250. The pulser module 250 in turn has an output register 256 that is used as an input by a digital output module 260. The digital output module 260 is preferably located on the local processor of the protection device 185. Accordingly, in order for the digital output module 260 to receive the data from the output register 256 of the pulser module 250, the data in the register 256 are transmitted over the network 100 from the node processor 180 to the protection device 185. The digital output module 260 provides a trip output 266 that is coupled to the circuit breaker 45 (also shown in FIG. 1) associated with the circuit 15 the phasor values of which are being measured and computed.

The program objects that perform the functions of the inverse time module 240, the pulser module 250, and the digital output module 260 may reside on a voltage and current sensor device, such as the voltage and current sensor device 32A, or alternatively, on a node processor, for example, the node processor 180, or alternatively on the protection device 185. In one embodiment, the inverse time module 240 and the pulser module 250 are located on the node processor 180 and the digital output module 260 is located on the local processor associated with the protection device 185 associated with the circuit breaker 45. The digital output module 260 receives its input from the pulser module 250 over the network 100.

(7). Communications Module on the Node Processor

In the embodiment in FIG. 4, the node processor 180 also includes a communications module 280. The communications module 280 is used to make the data in the output registers 226, 236, 246, 256, and so on, of the node processor 180 accessible to remote modules or other nodes on the network 100. The communications module 280 may be similar or identical to the communications module 270 that runs on the local processor 92 of the voltage and current sensor 32A. (In general, a communications module, such as 270 or 280, is associated with each separate device that has its own CPU and communications port and provides for communications between the objects running on its CPU and objects on other devices via its communications port.) Like the communications module 270, the communications module 280 allows external devices and/or modules to link to or communicate with any of the modules or registers on the node processor 180. The communications module 280 preferably uses data communications techniques described in the aforementioned copending application Ser. No. 08/369,849.

The communications module 280 has a communications output register 286. The data in the communications output register 286 is transmitted via appropriate hardware such as a communications port 287 of the node processor 180 onto the data network 100.

(8). Phasor Summation Module

Figure 5:
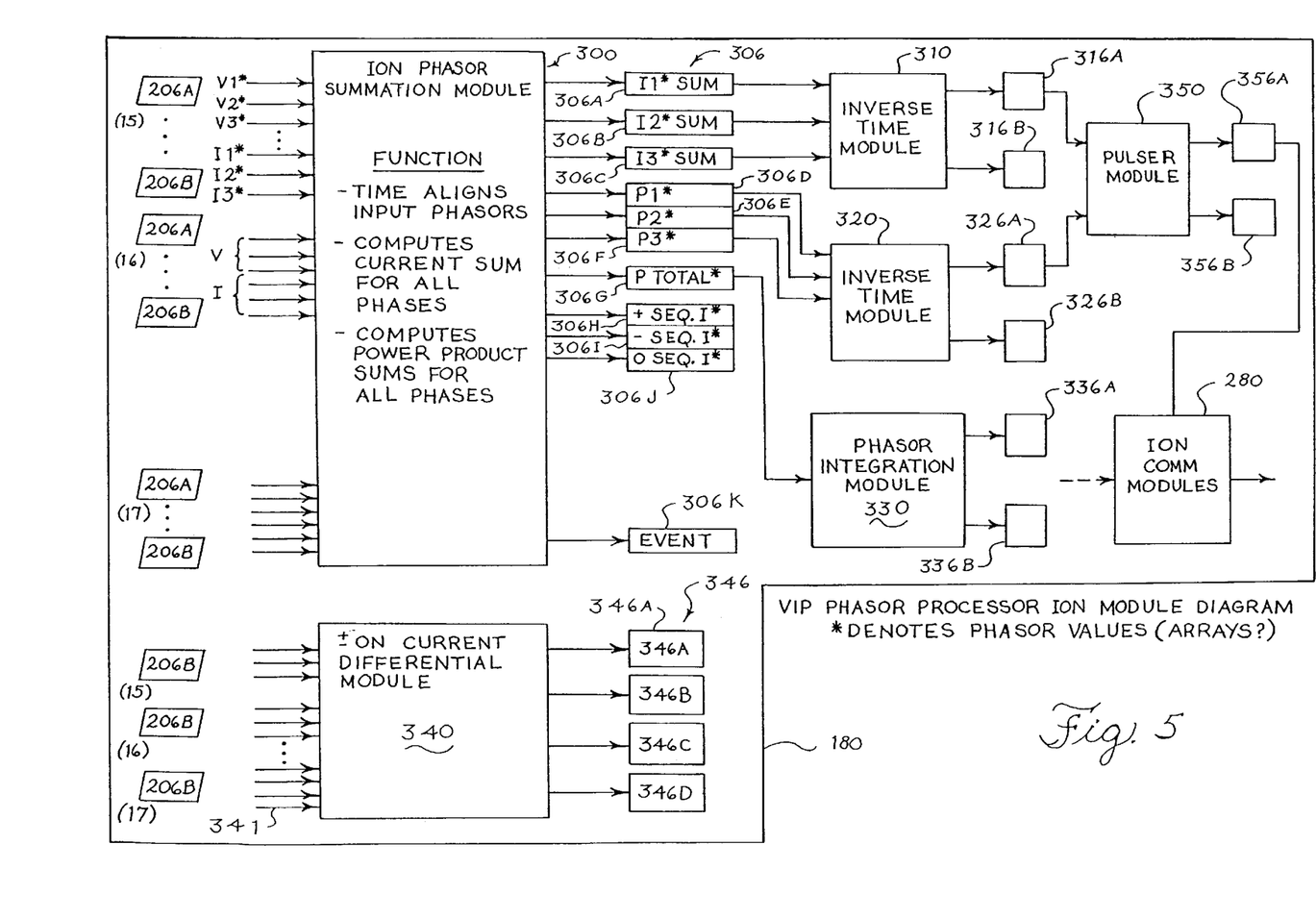
FIG. 5 is a block diagram illustrating additional program functions incorporated on a node processor in the embodiment of FIG. 1.

FIG. 5 is a functional diagram showing additional program objects. In a preferred embodiment, the program objects in FIG. 5 are located on the node processor 180. The modules in FIG. 5 utilize as their input, the data from the plurality of voltage and current sensor devices, such as the voltage and current sensor devices 30A, 30B, . . . 36C. Thus, the processor node 180 is able to process phasor data from a plurality of circuits, such as circuits 14, 15, 16, and 17. The program objects in FIG. 5 may receive some of their required input data over the network 100 from the voltage and current sensor devices 30A, 30B, . . . 36C. In addition, the program objects in FIG. 5 may receive some of their required input from other program objects running on the processor node 180.

A phasor summation module 300 uses as its inputs the data in the voltage and current output registers 206 from the plurality of phasor modules 200 for a plurality of circuits. For example, the phasor summation module 300 uses the values in the output registers 206 of the phasor modules 200 running on the voltage and current sensor devices associated with the phase conductors in each of the circuits (e.g. 14, 15, 16, 17, and so on) in the system 10. The phasor summation module 300 also includes an enable input 301 that enables operation of the module.

The phasor summation module 300 computes the vector sum of the input phasor arrays from the plurality of circuits. Specifically, the phasor summation module 300 computes the phasor sum of all the current phasor array inputs and generates a current phasor array result for each phase. The phasor summation module 300 also computes the power phasor arrays for the voltage-current input pairs and sums them both on a per-phase basis and on an all-phases basis. The resulting output is a net power phasor for each phase plus the net power phasor arrays for all phases.

The summation module 300 has the ability to buffer and time align the phasor array data from all the inputs so that the summation calculation uses data which is representative of the same instant in time. In addition, the summation module 300 has the ability to assign a polarity to each input phasor array register. This allows the summation module 300 to compute net values that represent either total or differential current, power, and energy. Total values for current, power and energy are advantageous when it is desired to measure the total power delivered to a plurality of circuits. Differential values for current, power, and energy are advantageous when it is desired to measure faults, power losses, or power delivered to a circuit which is not equipped with a voltage and current sensor device. Alternatively, instead of using voltage and current phasor arrays, the summation module 300 may use power phasor arrays to achieve a similar functionality and result. (Note that although the phasor summation module 300 may be used for computation of differential phasor values for current, power, and energy, these functions may also be performed by a separate module, such as the current differential module 340 described below. The computation of these differential values in the current differential module may be as a substitution for, or in addition to, the computation of these values in the phasor summation module.)

The phasor summation module 300 provides its output in the form of summation output registers 306. The summation output registers 306 include the following registers: (1) registers 306A, 306B, and 306C which include a register for a net current phasor array for each phase, plus net RMS current parameter for each phase, (2) registers 306D, 306E, and 306F which include a register for a net power phasor array for each phase, representing the total real and reactive power for each phase, (3) a register 306G including the net three phase power array, representing the total real and reactive power for all phases combined, (4) registers 306H, 306I, and 306J which include a register for the net positive, negative, and zero sequence current, and (6) and an event register 306K.

The summation module 300 is configurable. The summation module 300 may provide for configuration of type of phasor notation, e.g. polar, rectangular, complex, or exponential. The summation module 300 may also be configured to select a desired scaling, e.g. per unit, percent, or Engineering. The summation module 300 may also be configured to identify the voltage references, such as which voltage phasor array to associate with each current phasor array. In addition, the summation module 300 may be configured to provide for the selection of polarity for each input in order to identify whether an input should be added or subtracted when computing a sum.

(9). Current Differential Module

A current differential module 340 may also be included on the node processor 180. Like the phasor summation module 300, the current differential module 340 utilizes as its input the data from the output registers 206B from a plurality of voltage and current sensor devices, such as devices 30A, 30B, . . . 36C, which represent phasor data from a plurality of phase conductors of a plurality of circuits. The current differential module 340 receives these inputs over the network 100. The current differential module 340 also includes an enable input 341 that enables operation of the module.

The current differential module 340 time aligns the phasor arrays, computes the phasor sum of the current phasor inputs, and generates a phasor result for each enabled harmonic. The result is the total current in the circuits in the network, minus the total current out of the circuits in the network. In an ideal network, which is functioning correctly, this result will be zero. In a network with a fault, or internal losses, the result will be a non-zero value. The differential module 340 also computes the sum of all the power phasors for all of the voltage and current phasor input pairs for each enabled harmonic. The result is a differential power phasor that represents the real and reactive power losses in the system for each harmonic.

The current differential module 340 provides its output in the form of differential output registers 346. The differential output registers 346 include the following: (1) a register including the differential current for each harmonic 346A, (2) a register including the differential real power for each harmonic 346B, (3) a register including the differential reactive power for each harmonic 346C, and (4) an event register 346D.

The current differential module 340 may be configurable for selection of type of phasor notation (e.g. polar, rectangular, complex, or exponential), scaling (e.g. per unit, percent, or Engineering), harmonic bands enabled, and voltage references (e.g. which voltage phasor to be associated with each current phasor).

As mentioned above, the functions of the current differential module 340 may be performed in the phasor summation module 300.

(10). Summation Inverse Time Modules and Phasor Integration Module on the Node Processor The present embodiment may also include phasor summation inverse time modules, such as a current phasor summation inverse time module 310 and a power phasor summation inverse time module 320. Like the other modules, these may be located on the node processor 180 or may be located elsewhere. These inverse time modules perform a similar function as the inverse time module 240, except that the inverse time modules 310 and 320 use as their inputs the data in the phasor summation data output registers 306 of the phasor summation module 300. Specifically, the current phasor inverse time module 310 uses the data from the current phasor summation registers 306A, 306B, and 306C and the power phasor inverse time module 320 uses as its inputs the data from the power phasor summation registers 306D, 306E, and 306F. With regard to the current phasor summation inverse time module 310, this module performs an overcurrent protection function based upon the summation current phasor values. Since the summation phasor values are derived the several circuits, this module has the ability to perform its overcurrent protection function based on the several circuits that are used to form the summation net current phasor array for each phase. Similarly, with regard to the power phasor summation inverse time module 320, this module performs an overpower protection function based upon the summation power phasor values derived the several circuits that are used to form the summation power phasor array for each phase, representing the total real and reactive power for each phase. Since the summation phasor values are derived the several circuits, this module has the ability to perform its overpower protection function based on the several circuits that are used to form the summation net current phasor array for each phase.

The current phasor summation inverse time module 310 provides an output in the form of current phasor inverse time output registers 316. The current phasor inverse time output registers 316 include the following registers: (1) a state register 316A, (2) and (3) an event register 316B. The current phasor inverse time module 316 may be configurable.

Similarly, the power phasor summation inverse time module 320 provides an output in the form of power phasor inverse time output registers 326. The power phasor inverse time output registers 326 include the following registers: (1) a state register 326A, (2) and (3) an event register 326B. The power phasor inverse time module 32 may be configurable.

The state output register 316A of the current phasor inverse time module 310 and the state output register 326A of the power phasor inverse time module 320 are used as inputs by one or more pulser modules 350. The pulser module 350 may be similar to the pulser module 250. Like the pulser module 250, the pulser module 350 has an output register 356 that is used as an input by a digital output module. The output register 356 of the pulser module 350 may be used by more than one digital output module associated with more than one circuit. Since the summation current inverse time module 310 and the summation power inverse time module 320 represent values derived from several circuits, when an overcurrent or an overpower condition is detected based on the summation values, it may be desired to open more than one circuit. Accordingly, the output register 356 of the pulser module 350 may be sent to and used by digital output modules (such as the digital output module 260) located on several respective protections devices associated with separate circuits. Like the output 256 of the pulser module 250, the output 356 of the pulser module 350 may be transmitted over the data network 100. Accordingly for this purpose, the communications module 280 may be used, as described above.

(In an alternative embodiment, the pulser module 250 may be used to receive the data from the output registers 316A and 326A of the summation inverse time modules 310 and 320, respectively, and perform the functions of the pulser module 350.)

(11). Summation Phasor Integration Module on the Node Processor

The present embodiment may also include a phasor summation integration module 330. Like the other modules, this module may be located on the node processor 180 or may be located elsewhere. The phasor summation integration module 330 performs a similar function as the phasor integration module 230, except that the phasor summation integration module 330 uses as for its inputs the data in the phasor summation data output register 306G of the phasor summation module 300. As mentioned above, the data from in phasor summation register 306G includes the net three phase power array, representing the total real and reactive power for all phases combined Since the summation phasor values are derived the several circuits, this module has the ability to provide a time integration of phasor values, such as kilowatt-hours, except in the phasor domain. The phasor integration module 330 provides an output in the form of a phasor summation integration output register 336A and an event register 336B.

The integration module 330 may be configured in a manner similar to the integration module 230.

(12). Other Modules on the Node Processor

Other modules that may be located on a node processor include a symmetrical component module, a recorder module, a setpoint module, and arithmetic modules. The structure, function and operation of these modules are disclosed in the aforementioned copending application Ser. No. 08/369,849. For example, a symmetrical component module may provide in its output registers values for the positive, negative, and zero sequence current and voltage arrays.

8. System Synchronization

Referring to the synchronization circuit 166 in FIG. 2, it is noted that by using a GPS-type signal, all the voltage and current sensor devices in the system, such as sensor devices 30A, 30B, . . . 36C, can be synchronized to the same time reference. An advantage of such an arrangement is that all the voltage and current sensor devices can be configured to sample at the same time. However, such sampling may not necessarily be synchronous to the fundamental frequency of the electric power signal, thereby potentially introducing errors when the phasors are computed using fast fourier transform techniques. This is true especially for the phasors of the harmonics. Moreover, the phasors will rotate if the sampling is not done exactly synchronous to the fundamental frequency of the electric power signal.

One alternative is to sample at a frequency which is an exact multiple of the fundamental line frequency. This will provide for accuracy when using fast fourier transform techniques to compute phasors. However, this technique will not necessarily synchronize the sampling among the voltage and current sensor devices since the sample frequency may vary among the voltage and current sensor devices. Further, when the phasor data are sent from the voltage and current sensor devices to the node processors, computation becomes complicated because the different phasor measurements from the different voltage and current sensor devices need to be time aligned.

In a preferred embodiment, all the voltage and current sensor devices are configured to sample synchronously to the fundamental frequency of the electric distribution system signal. According to the preferred embodiment, one of the voltage and current sensor devices, e.g. 30A, is selected to act as a reference device for the entire system. The phase of a voltage input of this voltage and current sensor device becomes the reference phasor. The reference voltage and current sensor device computes the precise system frequency and the system "zero time reference" relative to the GPS-time clock. These values are transmitted to every other voltage and current sensor device, e.g. 30B, 30C, . . . 36C, in the system via the network 100 which in turn set their sampling to be simultaneous and synchronous to the reference system frequency.

This arrangement has several advantages. All sampling is synchronous so that the fast fourier transform results and the phasors for the harmonics are accurate. The phasors do not rotate except when the system dynamics change so data transmission and storage requirements can be drastically reduced.

9. Advantages of the Disclosed Embodiments

The voltage and current sensor device, described above, replaces the traditional analog current transformers (CT's) and voltage transformers (VT's) used in conventional prior art systems. The sensor device may be regarded as a sampler or sampling device because it outputs a stream of digital values that represent digitized samples of the electricity being distributed in the electric conductor to which it is associated. The sensor device may also be regarded as a phasor sampler because its output is a digital signal that represents the value of the phasor of the electricity distributed in the electric conductor with which it is associated.

It is an advantage of the detector device, as described above, that it combines a magnetic sensing portion with active electronics which makes it possible to actively correct for errors in the magnetic sensing portion using electronic means. This provides for major improvements over conventional current transformers in terms of accuracy, dynamic range, and frequency response.

It is another advantage of the sensor device, as described above, that the output is a low energy digital signal. This eliminates the potential safety problem with conventional current transformers. The digital output of the sensor device also eliminates the need for analog sensing and conditioning circuits in all of the metering, protection and control devices that are connected to the sensor device. The sensor device also eliminates the need for calibration in all of the downstream protection, control, and metering devices. This provides a very substantial cost savings for the connected devices and it provides a very large ongoing operating and maintenance cost savings.

The digital output of the voltage and current sensor device also makes it possible to use digital data transmission techniques (including digital radio, local area network, or fiber optics) to connect to devices instead of analog techniques. This is important because it removes the limitations on the distance between the sensor and the downstream devices, and it drastically reduces the amount of wiring required thereby providing large cost savings.

In addition, since the output of the sensor is a digital signal, it is possible to provide excellent high voltage isolation between the sensor and the network using fiber optic or digital radio or other means. This provides a large cost advantage compared to conventional analog sensor devices.

Another advantage of the above embodiments is the ability to time synchronize the sampling, buffering, and computation of multiple sensor devices so that the data received from a plurality of devices can be time-correlated. This allows the devices to be used to compute results for combinations of circuits which can substantially improve the system reliability, performance, and safety compared with conventional systems.

The above embodiments also provide the ability to compensate for errors that result from sampling at a frequency that is not synchronous to the fundamental frequency of the electricity in the circuit being monitored.

Another advantage of the embodiment of the sensor device disclosed above is the capability to attach and detach the sensor device to the electric conductor without deenergizing the electric circuit. This is important because the sensor is an active device that may periodically require maintenance.

Another important aspect of the invention is that sensor failure or tampering can be readily detected. It is difficult to detect failure tampering with conventional current transformers or voltage transformers.

Still a further advantage of the embodiments disclosed above is that they provide for a single sensing device to provide an output to a plurality of other devices, e.g. monitoring module devices. With conventional sensing devices, the sensing device output to only a single monitoring or protection device.

A still further advantage of the embodiments described above is that they can provide for high levels of frequency response thereby enabling the monitoring of high frequency harmonics. Conventional devices, because of their analog nature, do not monitor high frequency harmonics.

10. Alternative Embodiments

In an alternative embodiment of the voltage and current sensor device, the current sensing portion may be comprised of a Ragowski coil, or an optical fiber current sensor. The remaining portions of the voltage and current sensor device may be similar to the embodiment described above.

In the embodiment of the voltage and current sensor device described above, the device included both a voltage detection portion and a current detection portion. In alternative embodiments, the voltage detection portion and the current detection portion can be included in separate devices, each providing its own digital data output and each separately connected to the data network.

Figure 6:
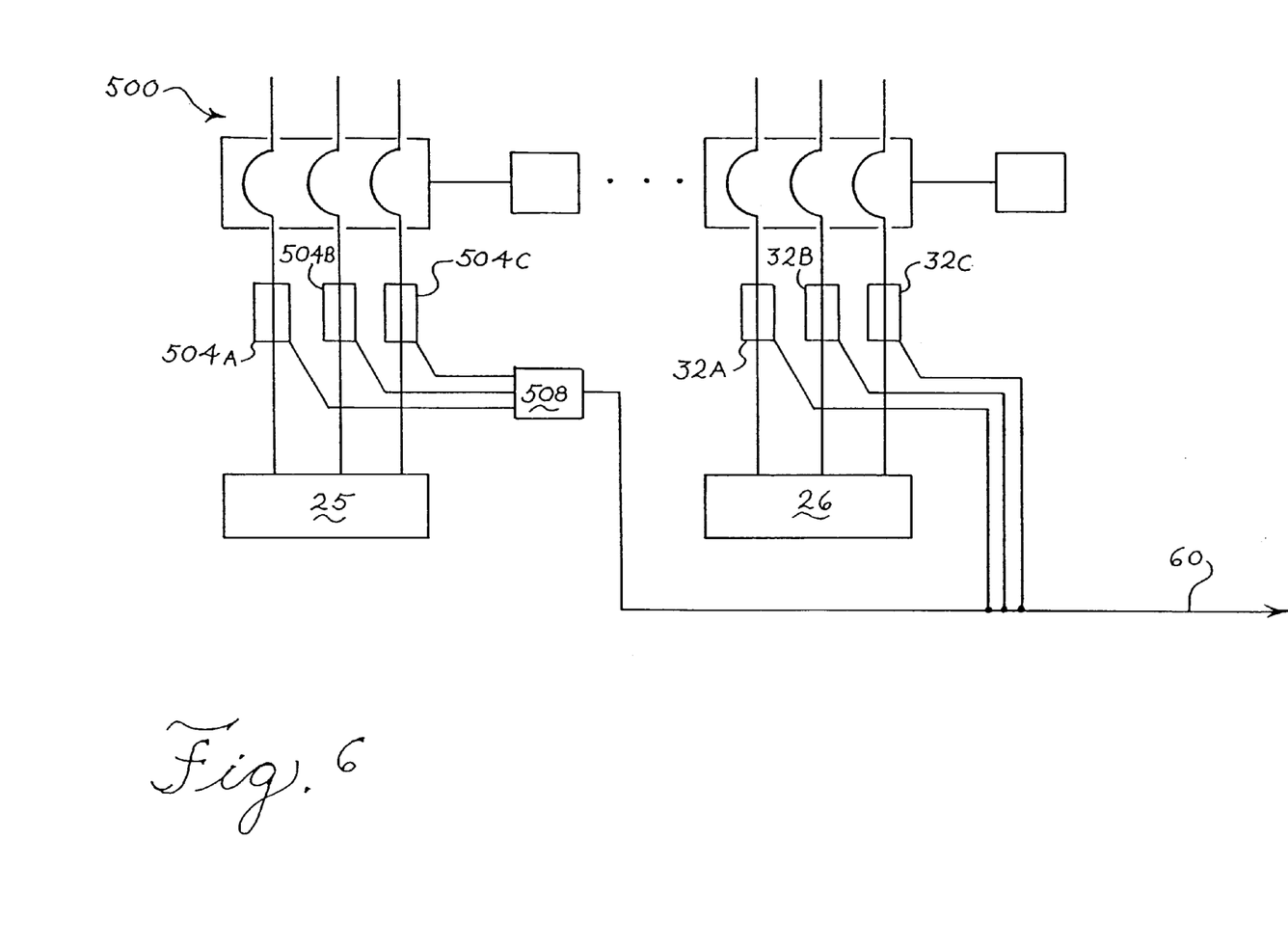
FIG. 6 is a diagram illustrating an alternative embodiment of the present invention.

An alternative embodiment of the system utilizes digital voltage and current sensor devices, as described above, in conjunction with conventional current and voltage transformers. Such a hybrid system is shown in FIG. 6. In FIG. 6, the circuit 15 of FIG. 1 is shown with the three voltage and current sensor devices 32A, 32B, and 32C associated with each of the three phase conductors 15A, 15B, and 15C. An additional circuit 500 has phase conductors 500A, 500B, and 500C. Associated with each of the phase conductors is a conventional voltage and current transformer, such as transformers 504A, 504B, and 504C. The conventional voltage and current transformers 504 provide analog outputs representative of the voltages and currents in each of the phase conductors of the circuit 500. The outputs of the conventional voltage and current transformers 504 are transmitted to a phasor transducer 508. The phasor transducer 508 may be similar or identical to the phasor transducers described in the copending application, entitled "PHASOR TRANSDUCER APPARATUS AND SYSTEM FOR PROTECTION, CONTROL, AND MANAGEMENT OF ELECTRICITY DISTRIBUTION SYSTEMS", Attorney Docket No. 6270-9, filed on even date herewith. The phasor transducer 508 is connected to the network 100. The phasor transducer 508 receives the analog outputs of the voltage and current transformers, transforms the analog signals to sampled digital values representative of the voltages and currents in the phase conductors of the circuit 500, computes phasor data representative of the sampled data, applies an appropriate time stamp to the sampled data, and makes the data available on the network 100. The data from the phasor transducer 508 is used by the node processors, such as node processors 180–183, in a similar manner as described above. The functions performed by the phasor transducer 508 are preferably implemented using the module object programming architecture, described above.

Those skilled in the art will also appreciate that the digital sensor embodiments could output data in different formats, such as a wavelet format.

It is also noted that where a plurality of circuits share a common voltage source (i.e. bus), it may be advantageous from an economic standpoint of equipment and installation costs to only equip one of the circuits with voltage sensing capability. This efficiency can be realized because the voltage value data generated by the one sensor can be used for the voltage dependent calculations for all the circuits that share a common voltage source It is intended that the foregoing detailed description be regarded as illustrative rather than limiting and that it is understood that the following claims including all equivalents are intended to define the scope of the invention.

I claim:

1. A protection device for protecting a multi-phase multi-conductor electric circuit from fault conditions on said electric circuit, the device comprising:

a plurality of digital sensors coupled to said electric circuit, each of said plurality of digital sensors generating digital data representative of a current in each of phase conductors of said electric circuit;

a data transmission network, coupled to said plurality of digital sensors, that receives said digital data representative of the current in each of said phase conductors of said electric circuit from said plurality of digital sensors;

a communications port that receives said digital data representative of the current in each of said phase conductors of said electric circuit from said data transmission network;

a processors coupled to said communications port, that receives said digital data representative of the current in each of said phase conductors of said electric circuit and executes one or more protection algorithms to determine whether the current through any of said phase conductors exceeds a predetermined safe operating limit; and a trip apparatus, coupled to said processor, that outputs a trip signal if the current through any of said phase conductors exceeds said predetermined safe operating limit.

2. The protection device of claim 1 wherein said protection algorithms include an inverse time function.

3. The protection device of claim 1 wherein said protection algorithms include a current summation function of said digital data.

4. The protection device of claim 1 wherein said protection algorithms include a current differential function.

5. The protection device of claim 1 wherein said data transmission network is a multi-point local area network.

6. The protection device of claim 1 wherein said trip apparatus is remote from said protection device and is coupled to said processor through said data transmission network.

7. The protection device of claim 1 wherein said digital data received from said digital sensors is phasor data.

8. The protection device of claim 1 wherein said digital data received from said digital sensors is waveform sample data.

9. The protection device of claim 1 wherein said protection algorithms are implemented as software objects which may reside on any node of said data transmission network.

10. A protection device for protecting a multi-phase multi-conductor electric circuit from fault conditions on said electric circuit, the device comprising:

a plurality of digital sensors coupled to said electric circuit, each of said plurality of digital sensors generating digital data representative of a current in each of phase conductors of said electric circuit;

a data transmission network, coupled to said plurality of digital sensors, that receives said digital data representative of the current in each of said phase conductors of said electric circuit from said plurality of digital sensors;

a communications port that receives said digital data representative of the current in each of said phase conductors of said electric circuit from said data transmission network;

a processor, coupled to said communications port, that receives said digital data representative of the current in each of said phase conductors of said electric circuit and executes one or more protection algorithms to determine whether the current through any of said phase conductors exceeds a predetermined safe operating limit; and a circuit breaker, coupled to said processor, that opens said electric circuit if the current through any of said phase conductors exceeds said predetermined safe operating limit.

11. The protection device of claim 10 wherein said protection algorithms include an inverse time function.

12. The protection device of claim 10 wherein said protection algorithms include a current summation function of said digital data.

13. The protection device of claim 10 wherein said protection algorithms include a current differential function.

14. The protection device of claim 10 wherein said data transmission network is a multi-point local area network.

15. The protection device of claim 10 wherein said trip apparatus is remote from said protection device and is coupled to said processor through said data transmission network.

16. The protection device of claim 10 wherein said digital data received from said digital sensors is phasor data.

17. The protection device of claim 10 wherein said digital data received from said digital sensors is waveform sample data.

18. The protection device of claim 10 wherein said protection algorithms are implemented as software objects which may reside on any node of said data transmission network.

19. A protection device for protecting a multi-phase multi-conductor electric circuit from fault conditions on said electric circuit, the device comprising:

a plurality of digital sensors coupled to said electric circuit, each of said plurality of digital sensors generating digital data representative of a current in each of phase conductors of said electric circuit;

a data transmission network, coupled to said plurality of digital sensors, that receives said digital data representative of the current in each of said phase conductors of said electric circuit from said plurality of digital sensors;

a communications port that receives said digital data representative of the current in each of said phase conductors of said electric circuit from said data transmission network;

a processor, coupled to said communications port, that receives said digital data representative of the current in each of said phase conductors of said electric circuit and executes one or more protection algorithms to determine whether the current through any of said phase conductors exceeds a predetermined safe operating limit;

a trip apparatus, coupled to said processor, that outputs a trip signal if the current through any of said phase conductors exceeds said predetermined safe operating limit; and a circuit breaker, coupled to said trip apparatus, that opens said electric circuit if said trip signal indicates that the current through any of said phase conductors exceeds said predetermined safe operating limit.

20. The protection device of claim 19 wherein said protection algorithms include an inverse time function.

21. The protection device of claim 19 wherein said protection algorithms include a current summation function of said digital data.

22. The protection device of claim 19 wherein said protection algorithms include a current differential function.

23. The protection device of claim 19 wherein said data transmission network is a multi-point local area network.

24. The protection device of claim 19 wherein said trip apparatus is remote from said protection device and is coupled to said processor through said data transmission network.

25. The protection device of claim 19 wherein said digital data received from said digital sensors is phasor data.

26. The protection device of claim 19 herein said digital data received from said digital sensors is waveform sample data.

27. The protection device of claim 19 wherein said protection algorithms are implemented as software objects which may reside on any node of said data transmission network.

* * * * *

UNITED STATES PATENT AND TRADEMARK OFFICE
CERTIFICATE OF CORRECTION

PATENT NO. : 6,236,949 B1
DATED : May 22, 2001
INVENTOR(S) : Ronald G. Hart

It is certified that error appears in the above-identified patent and that said Letters Patent is hereby corrected as shown below:

Claim 1,
Line 17, delete "processors" and substitute -- processor, -- in its place.

Signed and Sealed this

Twenty-sixth Day of March, 2002

Attest:

JAMES E. ROGAN
*Attesting Officer*     *Director of the United States Patent and Trademark Office*